United States Patent [19]
Hood, III et al.

[11] Patent Number: 6,049,469
[45] Date of Patent: Apr. 11, 2000

[54] COMBINATION ELECTROMAGNETIC SHIELD AND HEAT SPREADER

[75] Inventors: Charles D. Hood, III, Cedar Park; Damon W. Broder; Eric B. Holloway, both of Austin, all of Tex.

[73] Assignee: Dell USA, L.P., Round Rock, Tex.

[21] Appl. No.: 08/915,090

[22] Filed: Aug. 20, 1997

[51] Int. Cl.⁷ .................................................. H05K 9/00
[52] U.S. Cl. ..................... 361/818; 361/710; 361/719; 361/816; 257/707; 257/719; 174/35 R; 438/122
[58] Field of Search ................... 361/707, 710, 361/718–720, 816, 818, 799, 800; 257/706, 707, 713, 718, 719, 728; 438/122; 165/80.2, 80.3; 333/12; 174/35 R

[56] References Cited

U.S. PATENT DOCUMENTS

| | | | |
|---|---|---|---|
| 4,563,725 | 1/1986 | Kirby | 361/708 |
| 4,594,221 | 6/1986 | Caron et al. | 420/485 |
| 4,680,676 | 7/1987 | Petratos et al. | 361/818 |
| 4,728,372 | 3/1988 | Caron et al. | 148/554 |
| 5,175,613 | 12/1992 | Barker, III et al. | 361/818 |
| 5,218,760 | 6/1993 | Colton et al. | 29/845 |
| 5,241,453 | 8/1993 | Bright et al. | 361/704 |
| 5,285,350 | 2/1994 | Villaume | 165/80.3 |
| 5,287,001 | 2/1994 | Buchmann et al. | 257/719 |
| 5,307,236 | 4/1994 | Rio et al. | 361/818 |
| 5,357,404 | 10/1994 | Bright et al. | 361/818 |
| 5,436,803 | 7/1995 | Annis et al. | 361/818 |
| 5,451,720 | 9/1995 | Estes et al. | 174/250 |
| 5,504,652 | 4/1996 | Foster et al. | 257/719 |
| 5,541,811 | 7/1996 | Henningsson et al. | 361/704 |
| 5,548,090 | 8/1996 | Harris | 174/252 |
| 5,550,711 | 8/1996 | Burns et al. | 361/728 |
| 5,566,052 | 10/1996 | Hughes | 361/704 |
| 5,575,288 | 11/1996 | Sliwa, Jr. et al. | 600/445 |
| 5,589,711 | 12/1996 | Sano et al. | 257/718 |
| 5,647,748 | 7/1997 | Mills et al. | 439/81 |
| 5,740,013 | 4/1998 | Roesner et al. | 361/697 |
| 5,796,578 | 8/1998 | Jones | 361/683 |
| 5,804,875 | 9/1998 | Remsburg et al. | 257/718 |
| 5,815,371 | 9/1998 | Jeffries et al. | 361/704 |

OTHER PUBLICATIONS

Machinery's Handbook, 24th ed., Oberg, Jones, Horten and Ryffel, Industrial Press Inc., p. 364, 1992.

Online Computer Search Results of Jul. 3, 1997, http://www.olinbrass.com/c7025.html, "Olin C7025", pp. 1–3, Table 1 p. 1, Tables 2 and 3 p. 1, Figure 1 p. 1, Figure 5 p. 1, Figure 6 p. 1.

U.S. Patent Application Serial No. 08/406,627, entitled: Multi–Layer EMI Shielding Apparatus, filed Mar. 20, 1995, inventors Todd Steigarwald and Joe Llams.

Brush Wellman Brochure, "Properties of Copper Alloys" (3 pages).

*Primary Examiner*—Gerald Tolin
*Assistant Examiner*—John B. Vigushin
*Attorney, Agent, or Firm*—Skjerven, Morrill, MacPherson, Franklin & Friel, L.L.P.; David G. Dolezal

[57] ABSTRACT

An apparatus for providing heat dissipation and electromagnetic shielding for an integrated circuit, such as a CPU, in a computer system includes a first surface thermally coupling the apparatus to an integrated circuit (IC). The apparatus, including the first surface, is of a material, such as some alloys of beryllium copper, with a yield strength of at least 80,000 pounds per square inch and with a thermal conductivity of at least 220 watts/meter*degree (Kelvin). The material is electrically conductive.

30 Claims, 2 Drawing Sheets

COMBINATION ELECTROMAGNETIC SHIELD AND HEAT SPREADER

CROSS-REFERENCE TO RELATED APPLICATIONS

This application relates to co-pending U.S. patent application Ser. No. 08/915,091, attorney docket No. M-4979 US, filed on even date herewith, entitled Electromagnetic Shield Connector and naming Charles D. Hood, III, and Damon W. Broder as inventors, the application being incorporated herein by reference in its entirety.

BACKGROUND OF THE INVENTION

1. Field of the Invention

The present invention relates to electromagnetic shielding and heat dissipation for a computer system and more specifically to an apparatus for providing both electromagnetic shielding and heat dissipation for integrated circuits in a computer system.

2. Description of the Related Art

Personal computer systems have attained widespread use. These personal computer systems now provide computing power to many segments of today's modern society. A personal computer system can usually be defined as a desktop, floor-standing, or portable microcomputer that includes a system unit having a central processing unit (CPU) with associated memory, a display panel, a keyboard, a hard disk storage device or other type of storage media such as a floppy disk drive or a compact disk read only memory (CD ROM) drive. These personal computer systems are information handling systems which are designed primarily to give independent computing power to a single user or group of users and are inexpensively priced for purchase by individuals or small businesses.

A portable computer is a self-contained personal computer designed to be easily moved to and operated in various locations. Portable computers are often referred to as laptop, notebook, or subnotebook computers. To be portable, these computers are small, compact, and lightweight. The conventional portable computer includes a base portion and a lid portion that pivotally opens from the base portion when the portable computer is in use. The lid portion contains a flat panel display such as a liquid crystal display (LCD) or other relatively small display.

Notebook computers incorporate electromagnetic shielding to reduce electromagnetic emissions in order to meet regulatory standards on such emissions. Portable computers also use thermal transfer mechanisms (heat-sinks or heat spreaders) to cool the CPU which accounts for almost half the power dissipated within the computer system.

An electromagnetic shield is typically a metallic partition placed between two regions of space. The electromagnetic shield controls the propagation of electric and magnetic fields from one of the regions to the other. An electromagnetic shield may be used to contain electromagnetic fields if the shield surrounds the source of the electromagnetic fields.

A solid electromagnetic shield that completely surrounds a product can be at any potential and still provide effective electromagnetic shielding. That is, the shield prevents outside influences from affecting circuits inside the electromagnetic shield and vice versa. Thus, the electromagnetic shield need not be grounded or have its voltage potential defined in any way. However, an ungrounded or undefined electromagnetic shield should completely enclose the object being protected and that object being protected should have no connection to the outside world.

In practice, however, the electromagnetic shield is not a complete enclosure, and the object inside does have connections to the outside world, either directly, through signal and/or power leads, or indirectly, through stray capacitance due to holes in the electromagnetic shield. In such cases, the electromagnetic shield should be grounded or have its voltage potential defined with respect to the noise source to prevent the noise source's potential from coupling to the enclosed object. An ungrounded or undefined electromagnetic shield's potential varies with conditions and location, and therefore the noise coupled to the object inside also varies.

Grounding also has other benefits. Grounding provides a path for radio frequency (RF) currents to flow on the structure. Grounding also prevents the buildup of AC potentials on the equipment enclosure. Grounding provides a fault-current return path to protect personnel from shock hazards. Grounding also prevents the buildup of static charge.

The electromagnetic shield should have a low-impedance coupling with a voltage reference such as a ground plane of a printed circuit board in at least two places in order to properly define the voltage potential or ground the electromagnetic shield in a computer system. However, today's computer systems include high frequency electromagnetic sources such as processors which may require the electromagnetic shield to be electrically coupled to a voltage reference such as a ground plane at several locations. The higher frequencies of these electromagnetic sources require closer spacings between the grounding connections of the electromagnetic shield to the voltage reference in order to provide effective electromagnetic shielding. Coupling a generally planar electromagnetic shield at several closely spaced locations around its perimeter allows an electromagnetic shield to form the top portion of an effective electromagnetic shield enclosure with a ground plane forming the bottom portion.

Electromagnetic shields constructed from an electrically conductive metal with a high yield strength give the shield resiliency in making electrical contact with an electrically conductive surface electrically coupled to a voltage reference such as a ground plane of a printed circuit board.

Heat distribution has also been a problem with some computers, especially with portable computers. In the past, "heat spreaders" have been used to address this problem. One type of heat spreader is a metal piece that is thermally coupled to a processor and distributes heat away from the processor. Typically, a heat sink is made of relatively pure aluminum for good thermal conductivity and for reduced weight. However, because aluminum is a relatively soft metal with a low yield strength, it makes for a poor electromagnetic shield in that extensions, such as spring fingers, made from aluminum are not resilient enough to continuously provide good electrical contact with another surface. Furthermore, oxide coatings typically form on the outside of items made with aluminum which reduces the ability of the object to provide low impedance electrical connections with other items in contact with the aluminum material. Because heat spreaders typically serve only one function, heat spreaders add extra pieces to the computer system assembly as well as increasing the complexity of the build and repair operations.

Typically, the electromagnetic shielding and the heat dissipation are performed by separate apparatuses. What is need is an apparatus that has the characteristics to be both a good electromagnetic shield and a good heat spreader.

SUMMARY OF THE INVENTION

It has been discovered that an apparatus constructed of a material with a yield strength of at least 80,000 pounds per square inch and with a thermal conductivity of at least 220 watts/meter*degree (Kelvin) enables the apparatus to function both as an electromagnetic shield and a heat spreader for an integrated circuit.

More specifically, in one aspect of the invention, an apparatus for providing heat dissipation and electromagnetic shielding for an integrated circuit includes a first surface. The first surface thermally couples the apparatus to an integrated circuit (IC). The apparatus, including the first surface, is of a material with a yield strength of at least 80,000 pounds per square inch and with a thermal conductivity of at least 220 watts/meter*degree (Kelvin). The material is electrically conductive.

In another aspect of the invention, a computer system includes an integrated circuit (IC) having an outer surface and a mounting board having a voltage reference. The IC is mounted to the mounting board. The computer system includes an electromagnetic shield thermally coupled to the outer surface. The electromagnetic shield is of a material with a yield strength of at least 80,000 pounds per square inch and with a thermal conductivity of at least 220 watts meter*degree (Kelvin). The material is electrically conductive. The electromagnetic shield is positioned to provide electromagnetic shielding and heat dissipation for the IC.

In another aspect of the invention, a computer system includes a printed circuit board having a ground plane and a first planar side and a central processing unit mounted on the first planar side of the printed circuit board. The central processing unit has an outer surface. The computer system also includes a memory electrically coupled to the central processing unit and an electromagnetic shield thermally coupled to the outer surface. The electromagnetic shield is of a material with a yield strength of at least 80,000 pounds per square inch and with a thermal conductivity of at least 220 watts/meter*degree(Kelvin). The material is electrically conductive. The electromagnetic shield is secured to the printed circuit board. The electromagnetic shield has a generally planar portion extending over at least a majority of the first planar side of the printed circuit board including the central processing unit.

In another aspect of the invention, an apparatus for electrically coupling an electromagnetic shield to a voltage reference is of a material with a yield strength of at least 80,000 pounds per square inch and with a thermal conductivity of at least 220 watts/meter*degree (Kelvin). The material is electrically conductive. The apparatus is electrically connected to an electromagnetic shield and is electrically contacting a first surface electrically coupled to a voltage reference.

Providing an apparatus constructed of a material with a yield strength of at least 80,000 pounds per square inch and with a thermal conductivity of at least 220 watts/meter*degree (Kelvin) enables the apparatus to function effectively as both a heat spreader and as an electromagnetic shield, thus eliminating the need for two separate apparatuses to perform these functions. Eliminating the use of two separate apparatuses reduces the cost to manufacture a computer system and reduces the space requirements in a computer system. Furthermore, by performing the heat spreading and electromagnetic shielding functions with one apparatus, the amount of grounding loops within a computer system is reduced.

Having yield strength of at least 80,000 pounds per square inch gives extensions, such as a spring fingers, extending from the apparatus resiliency in making continuous electrical contact with the printed circuit board or an object on the printed circuit board. This resiliency enables the extension to provide a low impedance coupling of the electromagnetic shield to a voltage reference.

Having a thermal conductivity of at least 220 watts/meter*degree (Kelvin) gives the apparatus the ability to effectively transfer heat away from an IC or processor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of the best contemplated mode for carrying out the invention. The description is intended to be illustrative of the invention and should not be taken to be limiting.

Figure 1:
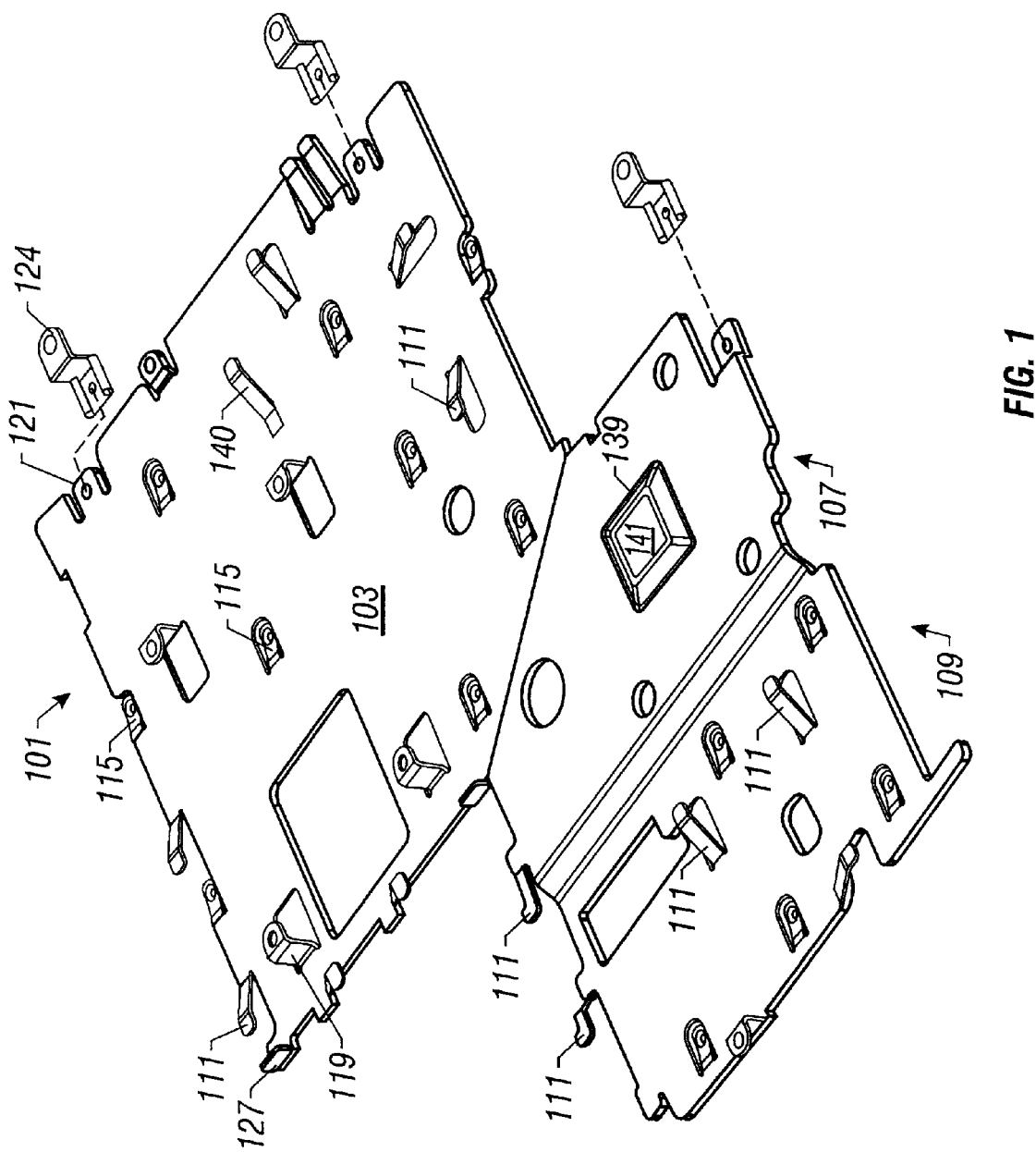
FIG. 1 shows one embodiment of an apparatus for heat dissipation and electromagnetic shielding according to the present invention.

FIG. 1 shows a perspective view of one embodiment of an apparatus for providing electromagnetic shielding and heat dissipation for an integrated circuit (IC) according to the present invention. Electromagnetic shield 101 includes a generally planar portion 103. Generally planar portion 103 includes a generally planar portion 107 that is at a higher plane than the rest of generally planar portion 103, relative to the view shown in FIG. 1. Generally planar portion 101 also includes a generally planar portion 109 which is connected to portion 107. Electromagnetic shield 101 also includes screw hole tabs 119 for mounting the shield to a printed circuit board or other type of mounting board with a screw. Electromagnetic shield 101 also includes attachment tabs 121 for attaching a detachable screw hole tab 124 to the shield. These attachment tabs 121 can also be used to electrically couple the shield 101 to the printed circuit board via the detachable screw tab 124. Electromagnetic shield 101 also includes extension tabs 127 which can be used to electrically couple the electromagnetic shield to a multiconductor connector. For example, see the application titled "Electromagnetic Shield Connector", Ser. No. 08/915,091.

Portion 107 of the electromagnetic shield 101 includes an emboss 139 that has a surface 141 that is at a higher plane than portion 107, relative to the view shown in FIG. 1. Emboss 139 and surface 141 thermally couple the shield to an integrated circuit such as a central processing unit. In one embodiment, surface 141 is in thermal contact with the integrated circuit. In another embodiment, the emboss is thermally connected to a heat sink that is in thermal contact with the integrated circuit. Because the emboss 139 is thermally coupled to the integrated circuit, shield 101 dissipates the heat from the integrated circuit throughout the electromagnetic shield 101.

Electromagnetic shield 101 includes spring fingers 111 which are extensions used to electrically couple the shield to a conductive surface on a printed circuit board. These spring fingers 111 are resiliently curved in order to continuously provide a force upon a conductive surface of a mounting board when the shield is secured to the mounting board. In the embodiment shown, spring fingers 111 are integrally connected to the generally planar portion 103. However, in other embodiments, spring fingers may be detachably attached via tabs 121. The electromagnetic shield 101 also includes spring fingers 115 for electrically connecting the electromagnetic shield 101 to either a metallic enclosure or the metallic coating of the inner side of a plastic enclosure encasing the shield and associated mounting board.

FIG. 1 also shows a spring finger 140 attached to the generally planar portion 103. In the embodiment shown, spring finger 140 is made of the same material as the electromagnetic shield 101. In the embodiment shown, spring finger 140 is soldered to the electromagnetic shield. Spring finger 140 may be attached to the electromagnetic shield 101 with the use of rivets or by other attaching techniques.

In the embodiment shown, electromagnetic shield 101 has the shape of two rectangles connected at their corners with the generally planar portions 107 and 109 forming one rectangle and the remainder of generally planar portion 103 forming the other rectangle. However, the shield may have other shapes. The side of electromagnetic shield 101 shown in FIG. 1 is the side that faces a printed circuit board when the electromagnetic shield 101 is attached to the printed circuit board.

Electromagnetic shield 101 is made of an electrically conductive material that has a yield strength of at least 80,000 pounds per square inch and a thermal conductivity of at least 220 watts/meter*degree (Kelvin). A yield strength of at least 80,000 pounds/square inch provides the spring fingers or other extensions made from that material with the resiliency to hold their form when pressed against a printed circuit board. This resiliency advantageously ensures that the spring fingers 111 maintain good electrical contact with the electrically conductive surfaces they are pressed against by providing a continuous force against those electrically conductive surfaces.

Having a thermal conductivity of at least 220 watts/meter*degree (Kelvin) enables the heat shield to adequately conduct heat away from a processor or other integrated circuit thermally coupled to shield 101. Some aluminum alloys, for example, have a thermal conductivity of approximately 220 watts/meter*degree (Kelvin) or greater. However, aluminum has a relatively poor yield strength. Thus, spring fingers made with aluminum would not hold their form as well when pressed against a printed circuit board. The thermal conductivity of a material is the amount of heat that a material can dissipate per unit of material. Thus, a heat dissipater made from a material with a lower thermal conductivity rating would require a greater cross sectional area to dissipate the same amount of heat as a structure made from a material with a higher conductivity rating.

Some material types which meet the yield strength and heat dissipation goals and are electrically conductive are some alloys of beryllium copper. Some beryllium copper alloys which meet these goals have the Unified Numbering System (UNS) number of C17510 and C17410. For example, one alloy of beryllium copper that has the desired thermal conductivity and yield strength properties is beryllium copper C17510 available from Brush Wellman (TM) having a temper of AT and a heat treatment or age hardening of three hours at 900° Fahrenheit (480° C.). This alloy has a yield strength of 80,000–100,000 pounds per square inch and a thermal conductivity of 240 watts/meter*degree (Kelvin). Another beryllium copper C17510 alloy which meets the yield strength and heat dissipation goals is the C17510 alloy with a temper HT, heat treated for two hours at 900° Fahrenheit (480° C.), having a yield strength of 95,000–120,000 pounds per square inch, and having a thermal conductivity of 240 watts/meter*degree (Kelvin). Another exemplative beryllium copper C17510 alloy, is one that has a temper of HTR and is mill hardened. This alloy has a yield strength of 110,000–140,000 pounds per square inch and a thermal conductivity of 240 watts/meter*degree (Kelvin).

Another beryllium copper alloy that meets the heat dissipation and yield strength goals are some beryllium copper alloys with a UNS number of C17410. Beryllium copper C17410 available from Brush Wellman (TM) having a temper of ½ HT and is mill hardened has a yield strength of 80,000–100,000 pounds per square inch and thermal conductivity of 230 watts/meter*degree (Kelvin). Beryllium copper alloy C17410 with an HT temper and is mill hardened has a yield strength of 100,000–120,000 pounds per square inch and a thermal conductivity of 230 watts/meter*degree (Kelvin).

To make electromagnetic shield 101, a flat sheet of a material meeting the above goals is cut into roughly the shape shown in FIG. 101. The sheet is also cut to form the shapes needed to make extensions such as spring fingers 111, 115, and tabs 127 and 119. The cut sheet is then pressed to give the electromagnetic shield 101 the form shown in FIG. 1. Afterwards spring finger 140 is soldered to the generally planar portion 103.

Figure 2:
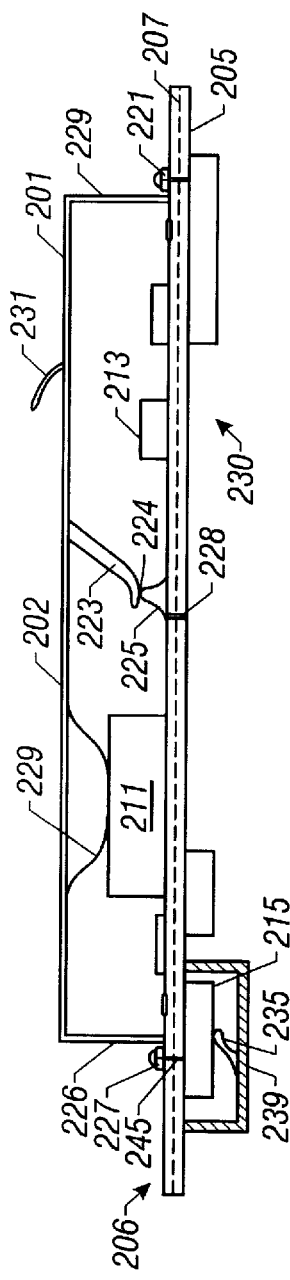
FIG. 2 shows a side view of one embodiment of a mounting board with an electromagnetic shield and heat dissipater according to the present invention.

FIG. 2 shows an embodiment of an electromagnetic shield mounted to a mounting board. Electromagnetic shield 201 is made of an electrically conductive material that has a yield strength of at least 80,000 pounds per square inch and a thermal conductivity of at least 220 watts/meter*degree (Kelvin). Electromagnetic shield 201 is attached to mounting board 205 via screw tab 220 and screw 221. In the embodiment shown, mounting board 205 is a printed circuit board or a printed wiring board. The electromagnetic shield 201 is also attached to printed circuit board 205 via extension 226 and solder 227. Electromagnetic shield 201 is electrically coupled to the ground plane 207 embedded within the printed circuit board 205. This electrical coupling is via screw 221, which electrically couples the screw tab 220 into the ground plane 207, and via the solder 227 that electrically couples extension tab 226 to the ground plane 207 by way of a via 245, which is a hole in the printed circuit board 205.

Shield 201 provides electromagnetic shielding for a majority of a planar side 206 of printed circuit board 205. More specifically, the electromagnetic shield 201 provides electromagnetic shielding for integrated circuits located beneath the generally planar portion 202 that is generally parallel with printed circuit board 207 and extends over a majority of the printed circuit board 205. Shield 201 provides electromagnetic shielding for integrated circuit 211 which in the embodiment shown, is a central processing unit, and a RAM memory 213 which is electrically coupled to the central processing unit 211. However, in other embodiments, the central processing unit 211 may be electrically coupled to other memories such as a hard drive or ROM.

Shield 201 includes an extension 223 which is a spring finger that extends from the planar portion 202 of electromagnetic shield 201. This spring finger 223 is resiliently curved to provide a downward force upon an electrically conductive surface 224 of a surface mount technology (SMT) ground standoff 225 located on planar side 206 of printed circuit board 205. Electrically conductive surface 224 is electrically coupled to the ground plane 207 via the electrically conductive plating of via 228. Because electromagnetic shield 201 is made of a material with a yield strength of at least 80,000 pounds per square inch, spring finger 223 is able to continuously provide a downward force upon surface 224. If spring finger 223 were made of an electrically conductive aluminum material, it would not be able to continuously provide a downward force upon surface 224. Because the yield strength of electrically conductive aluminum is comparatively lower, an aluminum spring finger could not hold its form against the counter force upward, relative to the view shown in FIG. 2, provided by the electrically conductive surface 224 when the shield 201 is in its position shown in FIG. 2.

Spring finger 223 electrically couples the shield 201 to the ground plane 207 to electrically ground the shield 201 to the computer system ground. However, in other embodiments, spring finger 223 may be used to electrically couple the shield 201 to another voltage reference which may be at another voltage potential with respect to the computer system ground.

Shield 201 also includes a spring finger 231 that extends from the planar portion 202 upwards, relative to the view shown in FIG. 2. Spring finger 231 is for contacting an electrically conductive surface of an enclosure that encases the printed circuit board 205 and electromagnetic shield 201.

FIG. 2 also shows a cut-away view of another electromagnetic shield made of an electrically conductive material that has a yield strength of at least 80,000 pounds per square inch and a thermal conductivity of at least 220 watts/meter*degree (Kelvin). In FIG. 2, shield 239 completely surrounds an integrated circuit such as a micro-controller 215 on five sides. Extending from electromagnetic shield 239 is extension 235 which is an attached spring finger that is resiliently curved. Spring finger 235 is thermally contacting a side of microcontroller 215. In the embodiment shown, shield 239 is a rectangular 5-sided box with an open side that is mounted against planar side 230 of printed circuit board 205. In this embodiment electromagnetic shield 239 along with printed circuit board 205 completely encloses the integrated circuit 215. Shield 239 provides electromagnetic shielding and heat dissipation for microcontroller 215.

Figure 3:
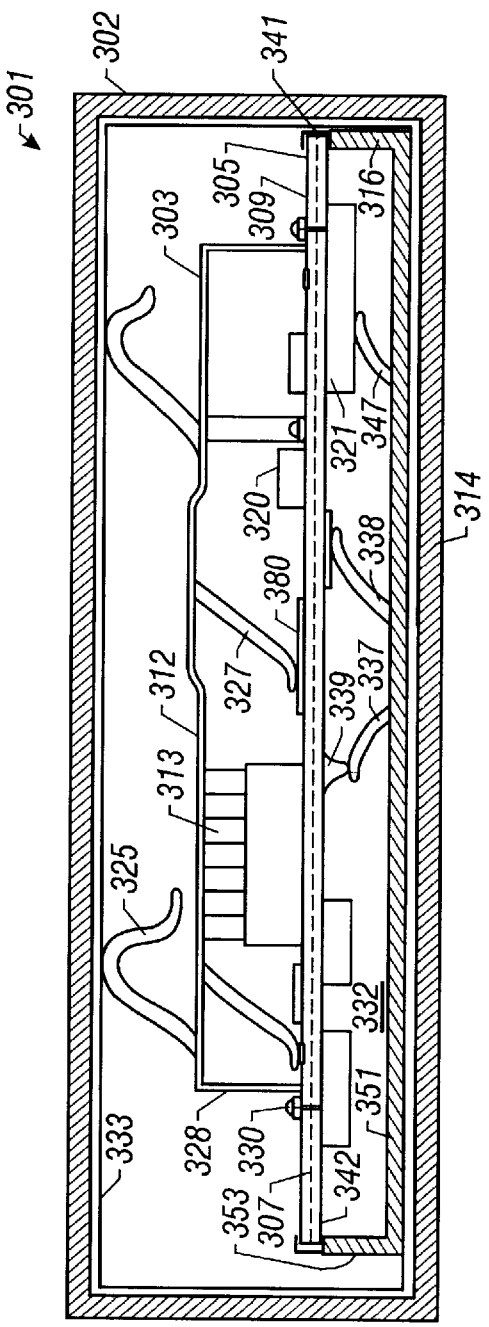
FIG. 3 shows a cut-away view of one embodiment of a computer system according to the present invention.

FIG. 3 shows one embodiment of a computer system including a printed circuit board and electromagnetic shields according to the present invention. Electromagnetic shield 303 is attached to a first planar side 309 of printed circuit board 305. Also mounted to planar side 309 is a central processing unit 316 which is electrically coupled to a RAM memory 320 also mounted on the planar side 309. The electromagnetic shield 303 is attached to the printed circuit board 305 via screw tabs 328 and screws 330. These screws 330 also ground the shield 303 to ground plane 307 embedded in the printed circuit board 305. In other embodiments, the ground plane may be located on the planar side 309 of the printed circuit board 305. Spring finger 327 extends from a generally planar portion 312 of electromagnetic shield 303. Spring finger 327 is resiliently curved to provide a downward force, relative to the view shown in FIG. 3, upon an electrically conductive surface 380 that is coupled to the ground plane 307 to electrically couple shield 303 to the ground plane 307.

Central processing unit 316 includes a heat sink 313 that is attached to the outer surface of central processing unit 313. Heat sink 313 dissipates heat from central processing unit 316. The electromagnetic shield 303 is also in thermal contact with heat sink 313 to thermally couple the electromagnetic shield 303 to the central processing unit 316. This heat sink 303 can be made of aluminum or other thermally conductive material. Heat sink 303 can also be made of the same material as electromagnetic shield 303.

Spring fingers 325 are extensions that extend from the generally planar portion 312 of electromagnetic shield 303. These spring fingers 325 electrically couple the electromagnetic shield 303 to an electrically conductive interior surface of the computer system enclosure 302. In the embodiment shown, enclosure 302 is of a plastic material with the interior side of the enclosure having a conductive metallic coating 333. In other embodiments, the enclosure 302 is constructed of a metal material. FIG. 3 shows the base portion of a portable computer with the display and keyboard not shown.

Computer system 301 also includes a second electromagnetic shield 316. Electromagnetic shield 316 provides electromagnetic shielding for the integrated circuits and other components mounted on planar side 342 of printed circuit board 305. Electromagnetic shield 316 is in the form of a 5-sided rectangular box with an open side that is mounted against planar side 342. Side portions 353 extend from the edges of the planar portion 351. Planar portion 351 is generally parallel to the planar side 342 of printed circuit board 305. Spring fingers 337, 338, and 347 extend from the planar portion 351 of electromagnetic shield 316. These spring fingers are resiliently curved to provide an upward force, relative to the view shown in FIG. 3, against the objects in which they contact. Spring finger 337 is in contact with an SMT ground standoff 339 which is electrically coupled to the ground plane 307. Spring finger 338 is electrically contacting a conductive surface on planar side 342. Spring finger 347 is thermally contacting the outer surface of integrated circuit 321. The purpose of spring finger 347 is to thermally couple the electromagnetic shield 313 to the integrated circuit 321 to dissipate heat from the integrated circuit 321.

The planar portion 351 of electromagnetic shield 316 extends over almost all of the planar side 342 of the printed circuit board 307. Electromagnetic shield 316 is attached to the edge of printed circuit board with clamps 341. These clamps also electrically couple electromagnetic shield 353 to ground plane 307.

The electromagnetic shields 303, in the embodiment shown, is electrically coupled to the ground plane 307 and accordingly has a voltage potential of the computer system ground. In other embodiments, shield 303 may be electrically coupled to another voltage reference which is at another DC voltage potential with respect to the computer system ground. Other types of voltage references include voltage reference planes embedded in the printed circuit board and voltage rails.

Electromagnetic shield 316 resides against the interior side of bottom portion 314 of enclosure 302 to thermally and electrically couple the electromagnetic shield 316 to the electrically conductive coating of bottom portion 314. Thermally coupling the electromagnetic shield 303 to the bottom portion aids in the dissipation of heat from integrated circuit 321.

Electromagnetic shields 303 and 316 along with the spring fingers 325, 327, 337, 338, and 347 are all made of an electrically conductive material that has a yield strength of at least 80,000 pounds per square inch and a thermal conductivity of at least 220 watts/meter*degree (Kelvin).

In other embodiments, the spring fingers 140 made of an electrically conductive material that has a yield strength of at least 80,000 pounds per square inch and a thermal conductivity of at least 220 watts/meter*degree (Kelvin) are attached or detachably attached to an electromagnetic shield or heat dissipater made of another material.

Other materials that are electrically conductive and meet the yield strength and the thermal conductivity goals listed above could also be used to make electromagnetic shield 101. One type of material which may have certain tempers that could be heat treated or mill hardened to meet the yield strength and the thermal conductivity requirements is a magnesium modified copper corson alloy with a UNS number of C7025.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An apparatus for providing heat dissipation and electromagnetic shielding for an integrated circuit, the apparatus comprising:

a first surface, the first surface thermally coupling the apparatus to an integrated circuit (IC);

wherein the apparatus, including the first surface, is of a material with a yield strength of at least 80,000 pounds per square inch and with a thermal conductivity of at least 220 watts/meter*degree (Kelvin), the material being electrically conductive.

2. The apparatus of claim 1 wherein the first material is an alloy of beryllium copper.

3. The apparatus of claim 2 wherein the first material has a Unified Numbering System (UNS) number of C17510 or C17410.

4. The apparatus of claim 1 wherein the first material is a magnesium modified copper corson alloy having a Unified Numbering System (UNS) number of C7025.

5. The apparatus of claim 1 wherein:

the apparatus has a generally planar portion.

6. The apparatus of claim 5 wherein:

the first surface is located on an emboss on the generally planar portion of the apparatus.

7. The apparatus of claim 1 further comprising:

an extension electrically connected to the apparatus, the extension having a first surface for electrically coupling the apparatus to a voltage reference of a mounting board.

8. The apparatus of claim 7 wherein the extension is a spring finger integrally connected to the apparatus.

9. The apparatus of claim 7 wherein the extension is a tab having a screw hole for securing the apparatus to the mounting board with a screw.

10. A computer system comprising:

an integrated circuit (IC) having an outer surface;

a mounting board having a voltage reference, the IC being mounted to the mounting board;

an electromagnetic shield thermally coupled to the outer surface, the electromagnetic shield being of a material with a yield strength of at least 80,000 pounds per square inch and with a thermal conductivity of at least 220 watts/meter*degree (Kelvin), the material being electrically conductive;

wherein the electromagnetic shield is positioned to provide electromagnetic shielding and heat dissipation for the IC.

11. The computer system of claim 10 further comprising:

an extension electrically and mechanically connected to the electromagnetic shield, the extension contacting a first surface physically coupled to the mounting board and electrically coupled to the voltage reference.

12. The computer system of claim 11 wherein the extension is a spring finger connected to the electromagnetic shield.

13. The computer system of claim 10 wherein the integrated circuit is a central processing unit.

14. The computer system of claim 10 wherein the electromagnetic shield has a portion that is embossed, the embossed portion thermally coupled to the outer surface of the integrated circuit.

15. The computer system of claim 10 wherein the material is a beryllium copper alloy.

16. The computer system of claim 15 wherein the material has a Unified Numbering System (UNS) number of C17510 or C17410.

17. The computer system of claim 10 wherein the material is magnesium modified copper corson alloy having a Unified Numbering System (UNS) number of C7025.

18. The computer system of claim 10 wherein the electromagnetic shield has a generally planar portion extending over at least a majority of the mounting board including over the IC mounted on the mounting board.

19. The computer system of claim 10 wherein the voltage reference is a ground plane.

20. A computer system comprising:

a printed circuit board having a ground plane and a first planar side;

a central processing unit mounted on the first planar side of the printed circuit board, the central processing unit having an outer surface;

a memory electrically coupled to the central processing unit;

an electromagnetic shield thermally coupled to the outer surface, the electromagnetic shield being of a material with a yield strength of at least 80,000 pounds per square inch and with a thermal conductivity of at least 220 watts/meter*degree(Kelvin), the material being electrically conductive, the electromagnetic shield secured to the printed circuit board, the electromagnetic shield having a generally planar portion extending over at least a majority of the first planar side of the printed circuit board including the central processing unit.

21. The computer system of claim 20 wherein the material is an alloy of beryllium copper.

22. The computer system of claim 20 wherein the material has a Unified Numbering System (UNS) number of C17510 or C17410.

23. The computer system of claim 20 wherein the material is a magnesium modified copper corson alloy having a Unified Numbering System (UNS) number of C7025.

24. The computer system of claim 20 further comprising:

an extension electrically and mechanically connected to the electromagnetic shield, the extension contacting a first surface located on the first planar side and electrically coupled to the ground plane.

25. The computer system of claim 24 wherein the extension is a spring finger connected to a generally planar portion of the electromagnetic shield.

26. The computer system of claim 24 wherein the first surface is located on a surface mount technology (SMT) standoff on the printed circuit board.

27. The computer system of claim 20 further comprising:

a housing enclosing the printed circuit board, the housing having an inner surface;

an extension mechanically and electrically connected to the electromagnetic shield, the extension contacting the inner surface of the housing.

28. The computer system of claim 20 further comprising:

a heat sink in thermal contact with the outer surface of the central processing unit, the heat sink in thermal contact with the electromagnetic shield.

29. An apparatus for electrically coupling an electromagnetic shield to a voltage reference wherein:

the apparatus is of a material with a yield strength of at least 80,000 pounds per square inch and with a thermal conductivity of at least 220 watts/meter*degree (Kelvin), the material being electrically conductive; and the apparatus is electrically connected to an electromagnetic shield and is electrically contacting a first surface electrically coupled to a voltage reference.

30. The apparatus of claim 29 wherein the material is an alloy of beryllium copper with a Unified Numbering System (UNS) number of C17510 or C17410.

* * * * *